United States Patent
Hood et al.

(10) Patent No.: US 7,280,362 B2
(45) Date of Patent: Oct. 9, 2007

(54) METHOD AND APPARATUS FOR ATTACHING A PROCESSOR AND CORRESPONDING HEAT SINK TO A CIRCUIT BOARD

(75) Inventors: Charles Hood, Cedar Park, TX (US); David Bryant, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 313 days.

(21) Appl. No.: 10/727,816

(22) Filed: Dec. 4, 2003

(65) Prior Publication Data

US 2005/0122690 A1 Jun. 9, 2005

(51) Int. Cl.
*H05K 7/20* (2006.01)
*H01R 13/00* (2006.01)
*H01R 13/62* (2006.01)

(52) U.S. Cl. .................. 361/719; 361/702; 361/709; 361/718; 439/331; 439/485

(58) Field of Classification Search ................ 361/719, 361/710, 702–703, 709, 718; 257/718–719; 439/485, 487, 331, 330; 165/80.3, 185
See application file for complete search history.

(56) References Cited

U.S. PATENT DOCUMENTS

| | | | | |
|---|---|---|---|---|
| 4,460,223 A | * | 7/1984 | Brown et al. ................. | 439/95 |
| 5,088,190 A | * | 2/1992 | Malhi et al. ................... | 29/843 |
| 5,241,453 A | * | 8/1993 | Bright et al. ................ | 361/704 |
| 5,302,853 A | * | 4/1994 | Volz et al. ................... | 257/707 |
| 5,761,036 A | * | 6/1998 | Hopfer et al. ............... | 361/704 |
| 5,886,871 A | | 3/1999 | Jeffries et al. | |
| 6,205,026 B1 | | 3/2001 | Wong et al. | |
| 6,563,213 B1 | | 5/2003 | Wong et al. | |
| 6,570,763 B1 | * | 5/2003 | McHugh et al. ............. | 361/704 |
| 6,791,847 B2 | * | 9/2004 | Ma ............................. | 361/816 |
| 6,832,919 B2 | * | 12/2004 | Ma et al. ....................... | 439/73 |
| 6,970,354 B2 | * | 11/2005 | Villanueva et al. ......... | 361/687 |
| 7,001,197 B2 | * | 2/2006 | Shirai et al. ................ | 439/331 |
| 2005/0030718 A1 | * | 2/2005 | Villanueva et al. ......... | 361/710 |

* cited by examiner

*Primary Examiner*—Jayprakash Gandhi
*Assistant Examiner*—Robert J. Hoffberg
(74) *Attorney, Agent, or Firm*—Haynes and Boone, LLP

(57) ABSTRACT

An apparatus for attaching a processor and corresponding heat sink to a circuit board includes a board member, a frame member mounted on the board member, a plurality of connector portions on the frame member, and a resilient load member. The resilient load member has a first end moveably connected to one of the connector portions and a second end forcibly connected to another one of the connector portions. A processor socket is mounted on the board member and a processor is seated in the processor socket. Forcible connection of the second end to its connector portion deforms the load member into engagement with the processor and urges the processor into the processor socket. A heat sink is mounted to the frame member and in thermal contact with the processor.

19 Claims, 7 Drawing Sheets

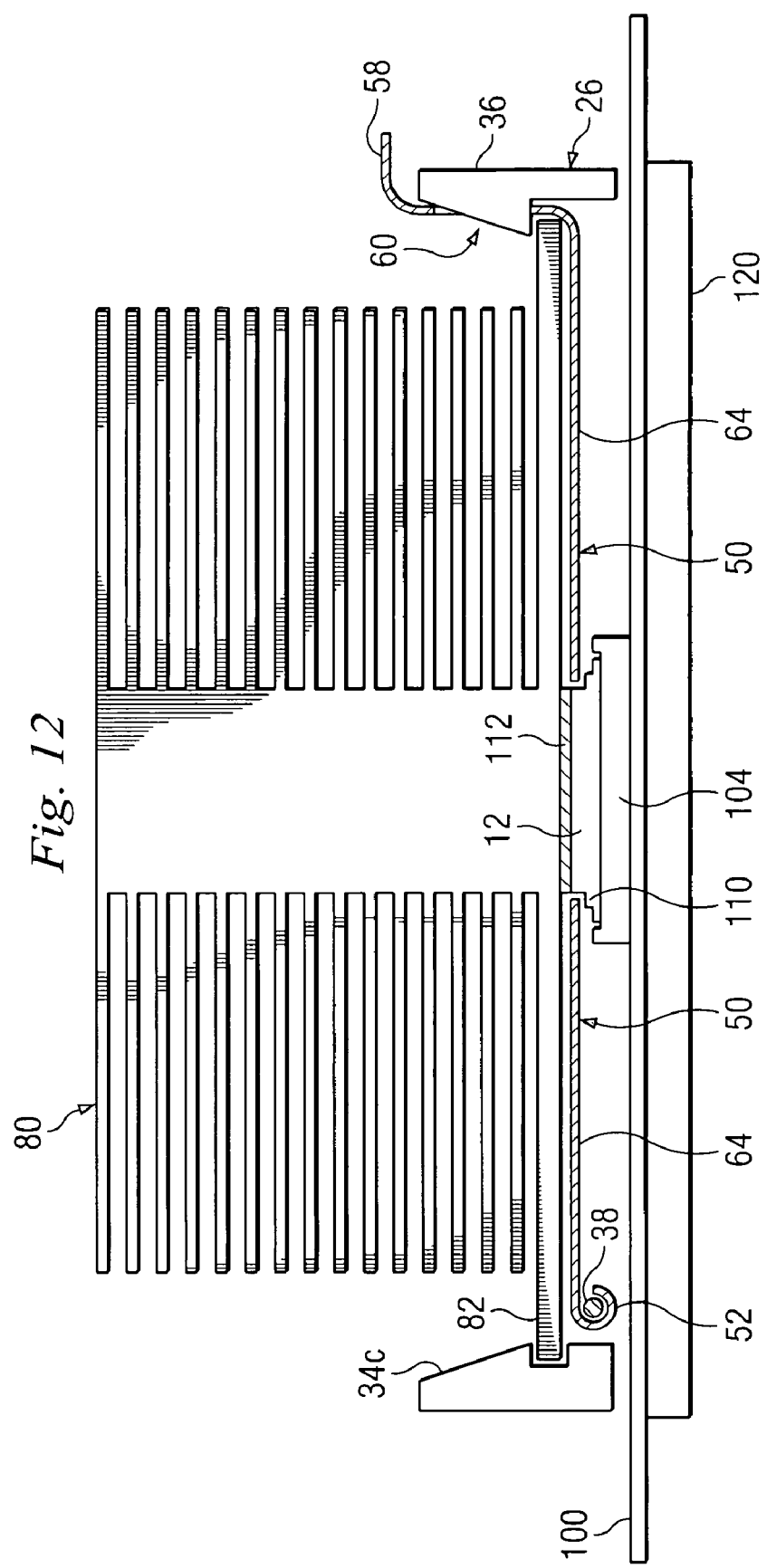

METHOD AND APPARATUS FOR ATTACHING A PROCESSOR AND CORRESPONDING HEAT SINK TO A CIRCUIT BOARD

BACKGROUND

The present disclosure relates generally to information handling systems, and more particularly to attaching a processor and corresponding heat sink to a circuit board.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A processor socket includes a plurality of contacts, each contact being soldered to a circuit board. In order for the information handling system to function, the processor must be mated to the processor socket so that the processor is connected to the other components of the information handling system through the soldered contacts. These soldered contacts are relatively strong when subjected to high compressive forces, but are much weaker with regard to other forces, such as shear forces or tensile forces. With certain processor and processor socket combinations, such as Land Grid Arrays (LGA) and Ball Grid Arrays (BGA), problems have arisen as higher and higher amounts of compressive force have become necessary to mate the processor with the processor socket.

Heat sinks are often used to help dissipate the thermal energy of the processor. A method of achieving the force needed to mate the processor and processor socket involves mounting the heat sink over the processor and onto the circuit board in a manner such that the heat sink engages the processor and provides the needed compressive force. A problem with this method is that the processor cannot be mated to the processor socket without the heat sink installed, and it is desirable that the processor socket be operational without the heat sink attached for purposes such as processor socket testing and qualification.

Processor and processor socket mating without use of a heat sink for these high force requirement combinations has been achieved by fabricating a retention device on the processor socket. Due to the high force requirements, these retention devices are made of metal, which increases the weight of the processor socket and creates reflow processing issues during board soldering. When a processor is mated to the processor socket, the retention device subjects itself to high stress in order to apply the needed compressive force. This stress warps the device, and consequently, the processor socket. When the processor socket has been soldered to the circuit board and has a processor mated to it, this warping applies non-compressive forces to the solder contacts, putting them under severe stress that can result in their failure. This method also requires an additional mechanism to attach the corresponding heat sink to the processor. When the heat sink is thermally connected to the processor, the thermal interface material can transmit movement of the heat sink to the processor and the solder contacts. Because the solder contacts are under severe stress, any shock to the heat sink risks breaking them.

Accordingly, it would be desirable to provide an apparatus for attaching a processor and corresponding heat sink on a circuit board in an information handling system absent the disadvantages found in the prior methods discussed above.

SUMMARY

According to one embodiment, a processor loading apparatus is provided that can apply the high amount of force necessary to mate a processor to a processor socket without subjecting the processor socket solder joints to unwanted stresses. To this end, a processor loading apparatus includes a board member, a frame member mounted to the board member, a plurality of connector members on the frame member, and a resilient load member. The resilient load member has a first end connected to one of the connector portions and a second end connected to another one of the connector portions. A processor socket is mounted to the board member and a processor is seated in the processor socket. The connection of the second end to the connector portion deforms the load member into engagement with the processor and urges the processor into the processor socket.

A principal advantage of this embodiment is that a high compressive load may be applied to a processor in order to mate it to a processor socket without subjecting the processor socket solder joints to forces that can cause their failure.

BRIEF DESCRIPTION OF THE DRAWINGS

FIG. 12 is a cross-sectional view illustrating an embodiment of a resilient load member in a retaining position with a heat sink mounted to a frame member.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
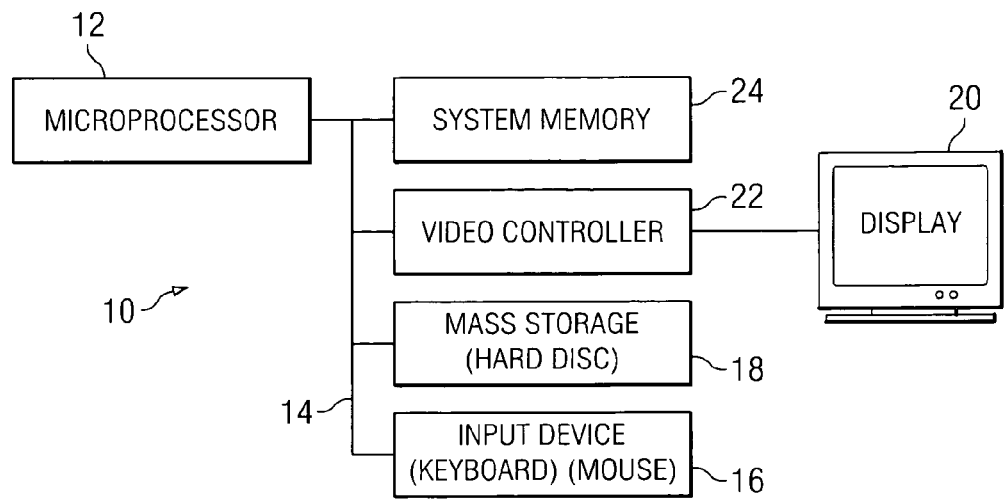
FIG. 1 is a diagrammatic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
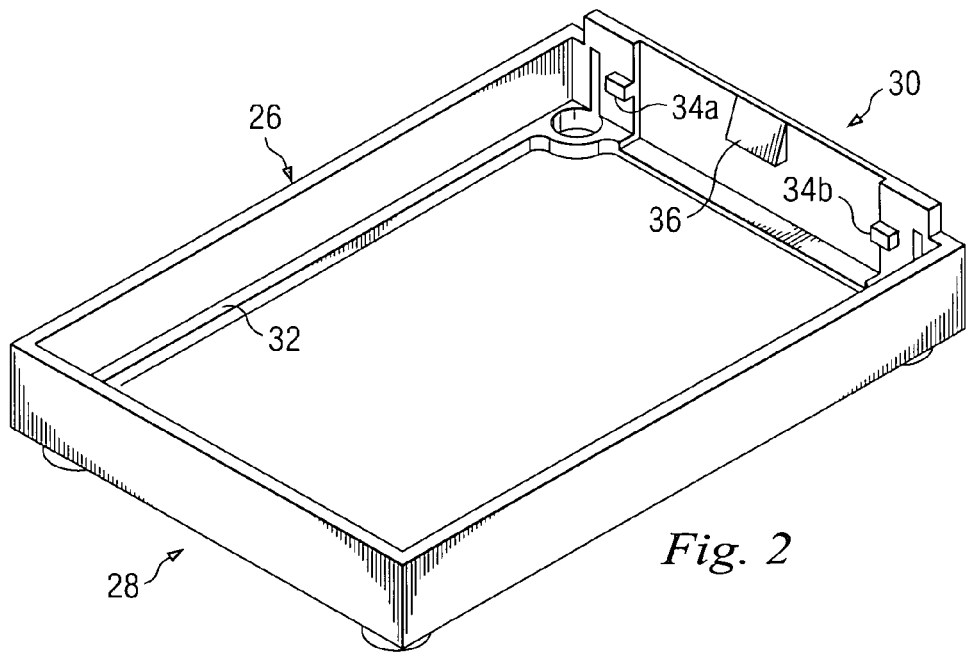
FIGS. 2 and 3 are perspective views illustrating an embodiment of a frame member.
Figure 3:
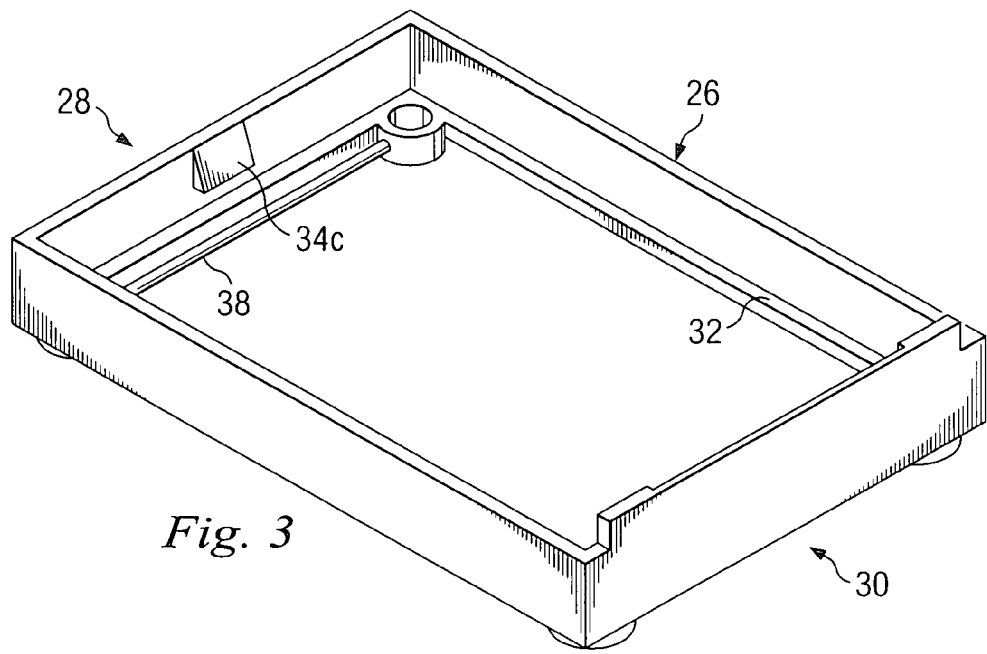

A frame member 26, FIGS. 2 and 3, includes a plurality of connector portions or members such as a connection end 28 and a retention end 30 that is opposite end 28. A heat sink engagement surface 32 extends between ends 28 and 30 and along end 28 and part of end 30. End 30 includes a plurality of retention members 34a and 34b which are spaced apart and each substantially the same distance above surface 32. Between members 34a and 34b is a retention member 36. End 28 includes a connection member 38 and a retention member 34c. Retention member 34c is substantially the same distance above surface 32 as are members 34a and 34b. Connection member 38 is located below surface 32.

Figure 4:
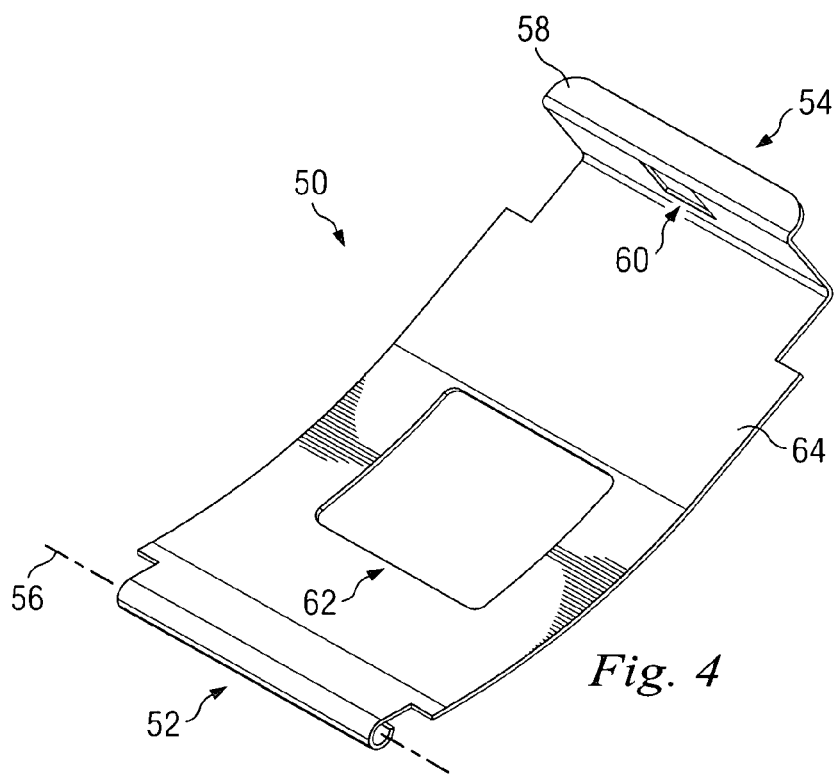
FIG. 4 is a perspective view illustrating an embodiment of a resilient load member.

A resilient load member 50, FIG. 4, includes a connection end 52 and a retention end 54. Member 50 rests in a curved state when there is no load applied to it. A connection axis 56 is located on end 52 such that member 50 may rotate about axis 56. A handle 58 is located on end 54 and a retention opening 60 is located below handle 58. A load member surface 64 extends between ends 52 and 54 and includes a processor opening 62.

Figure 5:
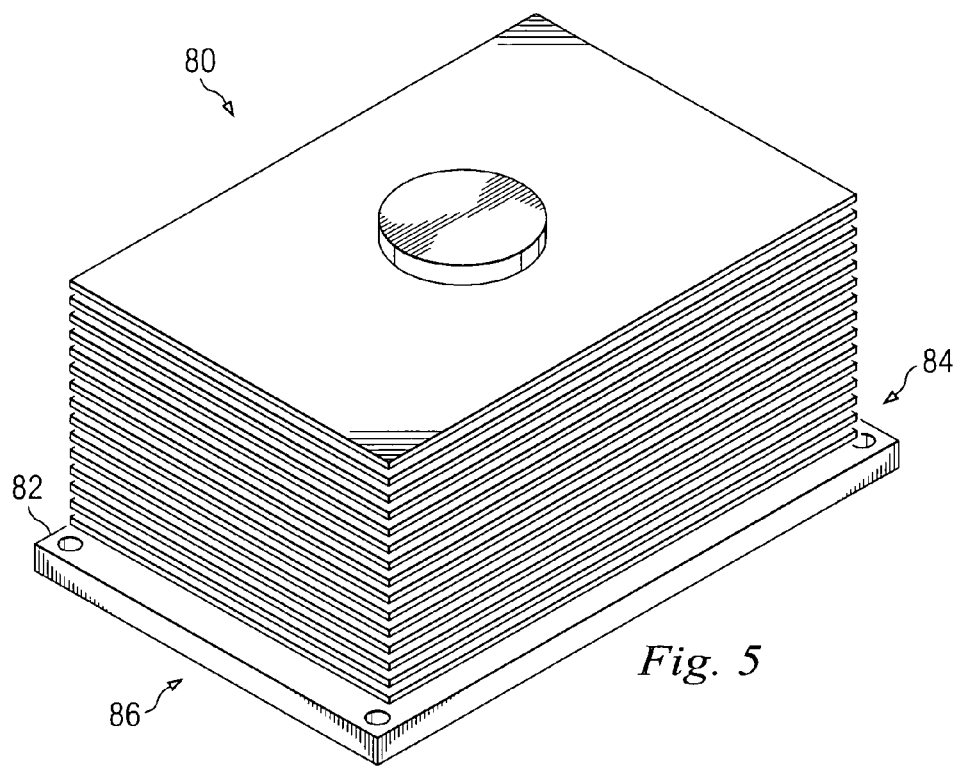
FIG. 5 is a perspective view illustrating an embodiment of a heat sink.

A heat sink 80, FIG. 5, includes a heat sink base 82 and a pair of opposed connection ends 84 and 86.

Figure 6:
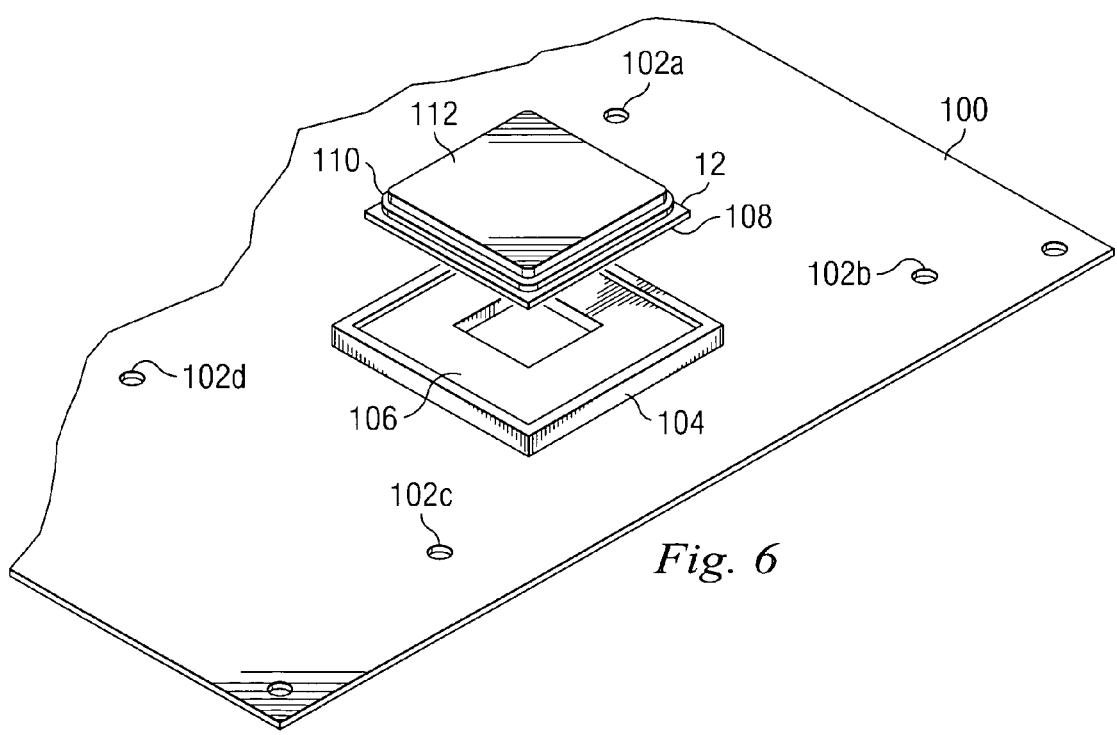
FIG. 6 is a exploded perspective view illustrating an embodiment of a board member, a processor socket, and a processor.

A board member 100, FIG. 6, includes a plurality of mounting openings 102a, 102b, 102c, and 102d. A processor socket 104 is mounted on member 100, typically by soldering. A processor receiving surface 106 is located on socket 104. A microprocessor 12 includes a mating surface 108 and may be seated in socket 104 by engaging surface 108 with surface 106. A load member contact surface 110 is located on processor 12. A thermal connection surface 112 is also located on processor 12, above surface 110.

Figure 7:
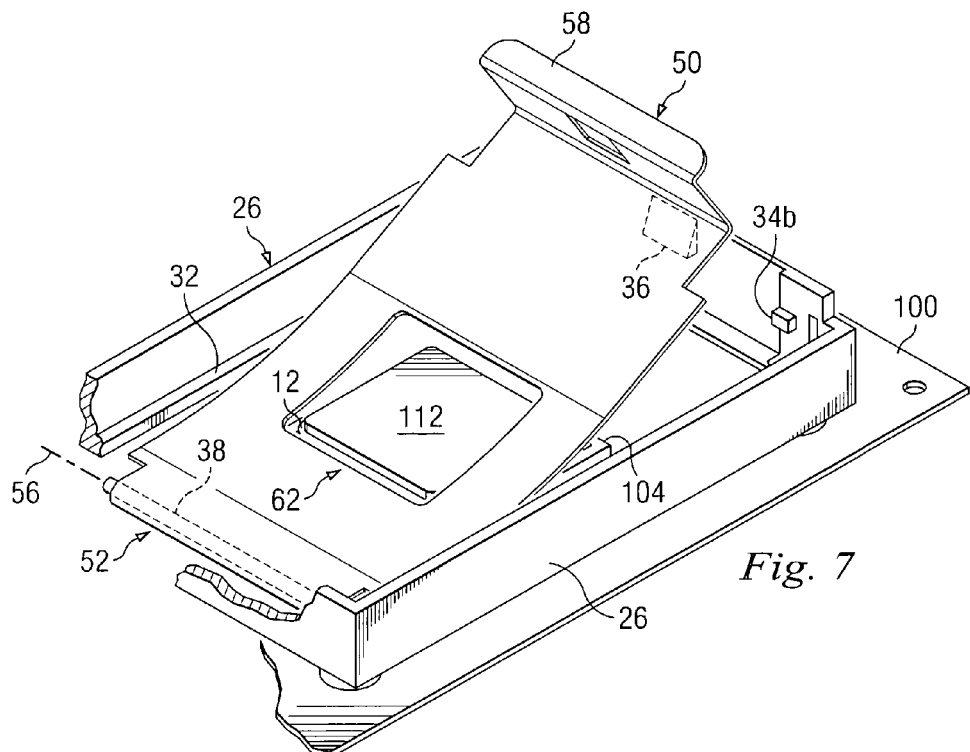
FIGS. 7 and 8 are perspective views illustrating an embodiment of a resilient load member connected to a frame member in an open position.
Figure 8:
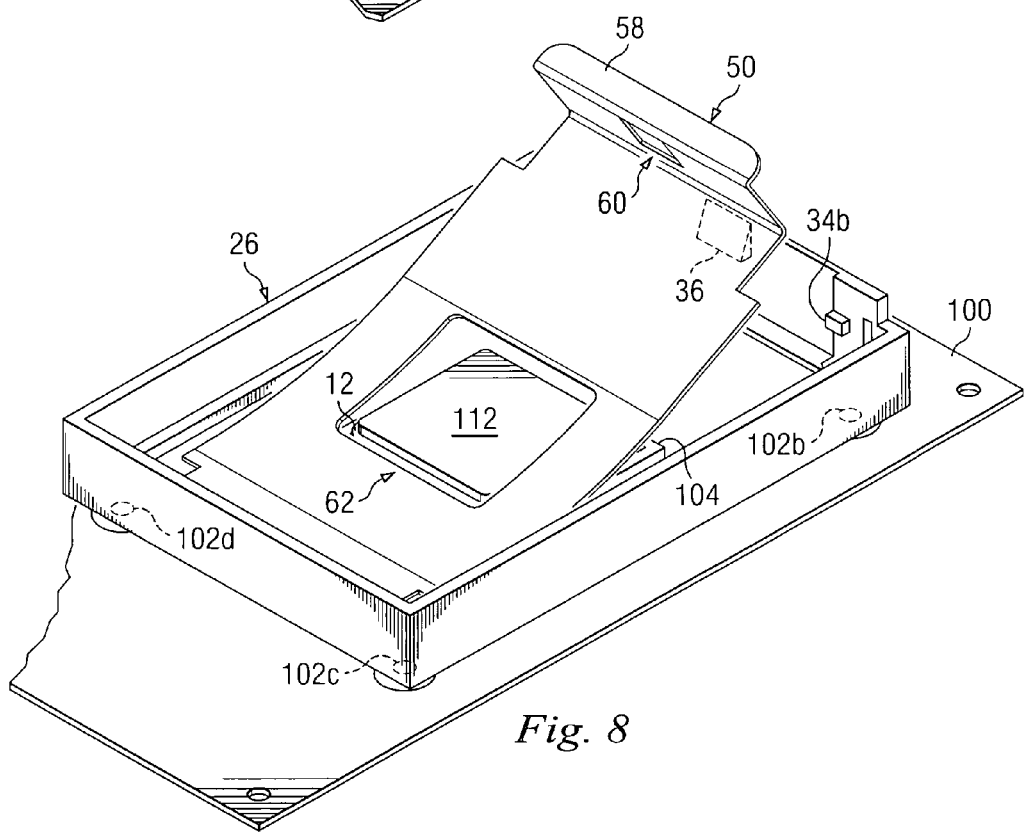

In operation, FIGS. 7 and 8, processor socket 104 is mounted to board member 100. Processor 12 is seated in socket 104. Frame member 26 is mounted on board 100 through mounting openings 102a-d, visible in FIG. 6. Connection end 52 of resilient load member 50 is pivotally connected to connection member 38 so that member 50 can pivot about connection axis 56. Processor opening 62 on member 50 is positioned substantially above processor 12.

Figure 9:
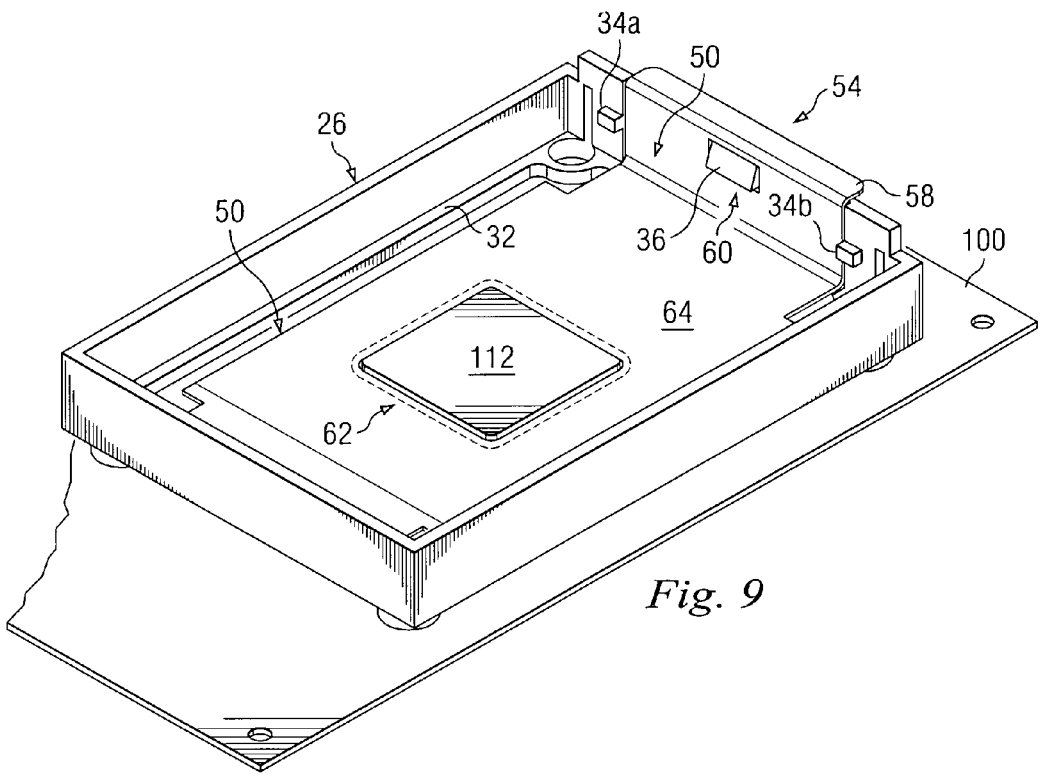
FIG. 9 is a perspective view illustrating an embodiment of a resilient load member connected to a frame member in a retaining position.

When a load is applied to handle 58 on resilient load member 50, FIG. 9, member 50 engages contact surface 110 and urges processor 12 into processor socket 104. Connection end 54 can be secured in frame member 26 by engagement of retention member 36 in retention opening 60. With end 54 secured, a force is applied by load member 50 sufficient to mate processor 12 with socket 104. Load member surface 64 is located below heat sink engagement surface 32, and thermal connection surface 112 is exposed through opening 62.

Figure 11:
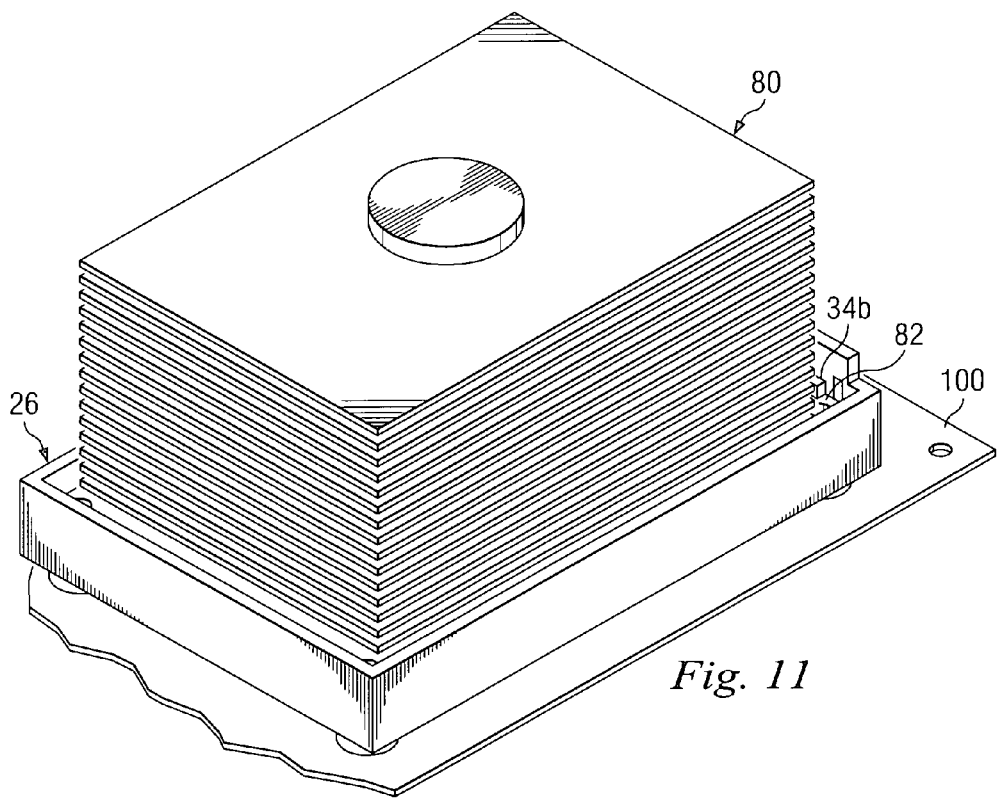
FIG. 11 is a perspective view illustrating an embodiment of a heat sink mounted to a frame member.
Figure 10:
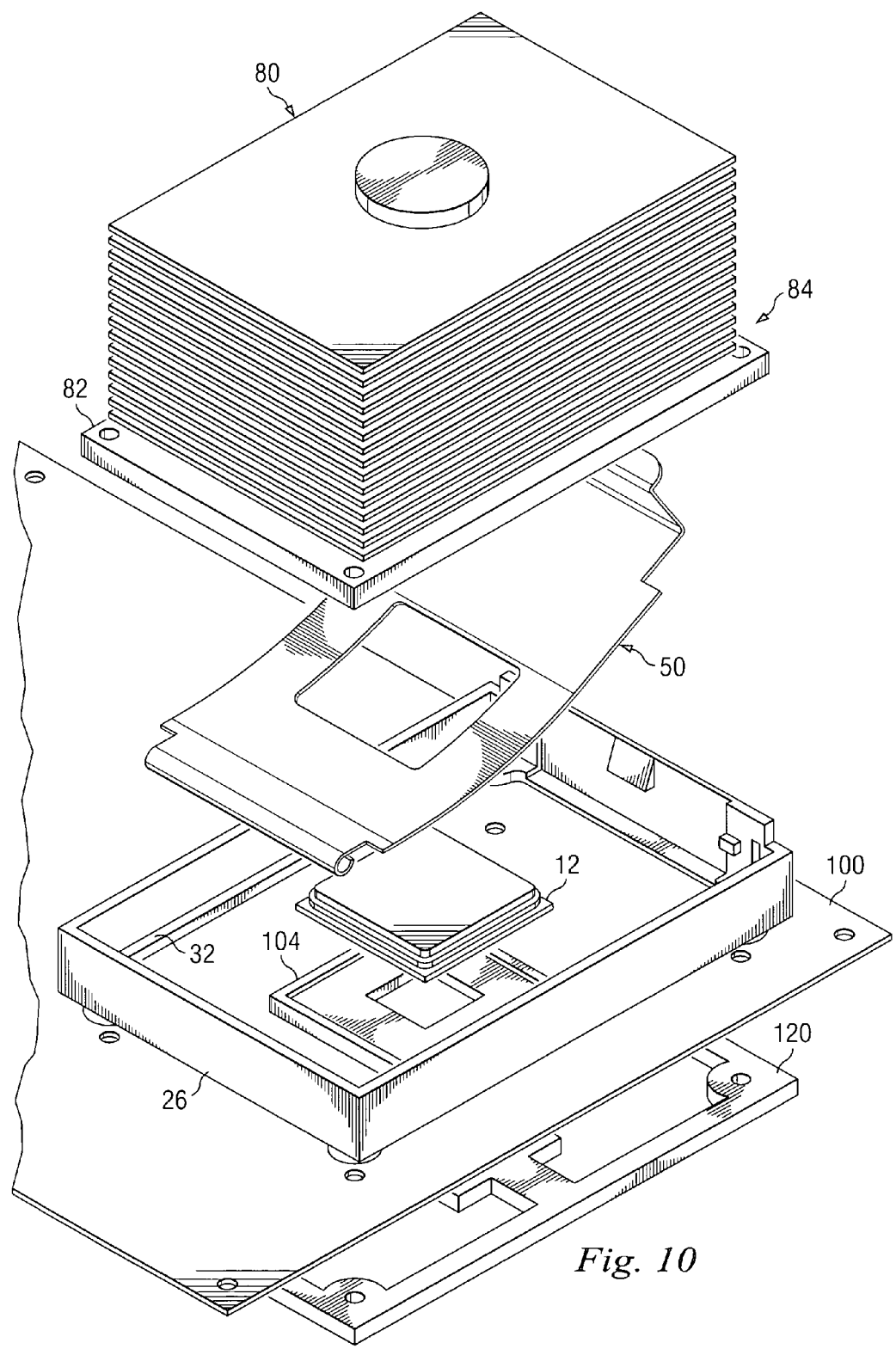
FIG. 10 is an exploded perspective view illustrating an embodiment of a support member, a board member, a frame member, a processor socket, a processor, a resilient load member, and a heat sink.

The heat sink 80, FIG. 10 and 11, can then be mounted on frame member 26. Processor socket 104 and frame member 26 are mounted on board 100, with processor 12 seated in socket 104 and resilient load member 50 connected to frame member 26. A support member 120 is mounted on an opposite side of board 100 from frame 26 to support the weight of heat sink 80 on board 100. Heat sink 80 is mounted in frame member 26, FIG. 5, 9, 11, and 12, by engaging heat sink base 82 with heat sink engagement surface 32. Connection end 84 is placed on surface 32 and beneath heat sink retention members 34a and 34b. Connection end 86 may then be used to secured heat sink 80 to frame member 26 by placing it on surface 32 and below heat sink retention member 34c. When heat sink 80 is secured to frame 26, heat sink 80 engages thermal connection surface 112 on processor 12 and is positioned above load member surface 64.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A processor loading apparatus comprising:
   a board member;
   a processor socket mounted on the board member;
   a processor seated in the processor socket;
   a frame member defining a processor aperture, comprising a heat sink engagement surface adjacent to the perimeter of the processor aperture, and mounted on the board member such that the processor extends into the processor aperture, wherein the heat sink engagement surface is operable to support a heat sink that is thermally coupled to the processor;

a plurality of connector portions on the frame member, one of the connector portions located in the processor aperture and below the heat sink engagement surface;

a curved resilient load member comprising a load member surface wherein the curved resilient load member comprises a first end connected to the connector portion located in the processor aperture and below the heat sink engagement surface and a second end connected to another one of the connector portions, whereby the connection of the second end deforms the curved load member into a substantially parallel engagement with the processor such that the load member surface is located below the heat sink engagement surface in order for the curved resilient load member to apply a constant compressive force to the processor sufficient to mate the processor with the processor socket; and the resilient load member having an opening formed therein permitting the processor to extend through the opening into contact with a heat sink, whereby the deformation of the curved resilient load member into a substantially parallel engagement with the processor results in a non-compressive force that is not transferred to the processor socket due to the coupling of the curved load member to the frame member.

2. The apparatus of claim 1 wherein the frame member surrounds the processor socket.

3. The apparatus of claim 1 further comprising:
a support member mounted on the board member adjacent to the frame member.

4. The apparatus of claim 1 wherein the first end of the resilient load member is pivotally connected to one of the connector portions and the second end is latched to another one of the connector portions.

5. The apparatus of claim 1 wherein the processor includes a thermal connection surface.

6. A heat sink mounting apparatus comprising:
a board member;
a support member mounted on the board member;
a processor socket mounted on the board member;
a processor seated in the processor socket;
a frame member defining a processor aperture, comprising a heat sink engagement surface adjacent to the perimeter of the processor aperture, and mounted on the board member such that the processor extends into the processor aperture;
a plurality of connector members on the frame member, one of the connector members located in the processor aperture and below the heat sink engagement surface;
a curved resilient load member comprising a load member surface wherein the curved resilient load member comprises a first end connected to the connector member located in the processor aperture and below the heat sink engagement surface and a second end connected to another one of the connector members, whereby the connection of the second end deforms the curved load member into a substantially parallel engagement with the processor such that the load member surface is located below the heat sink engagement surface in order for the curved resilient load member to apply a constant compressive force to the processor sufficient to mate the processor with the processor socket;
a heat sink mounted on the frame member in engagement with and supported by the heat sink engagement surface, thermally coupled to the processor, and located above the load member surface; and the resilient load member having an opening formed therein permitting the processor to extend through the opening into contact with the heat sink, whereby the deformation of the curved resilient load member into a substantially parallel engagement with the processor results in a non-compressive force that is not transferred to the processor socket due to the coupling of the curved load member to the frame member.

7. The apparatus of claim 6 wherein the frame member surrounds the processor socket.

8. The apparatus of claim 6 wherein the support member is mounted on an opposite side of the board from the frame member.

9. The apparatus of claim 6 wherein the first end of the resilient load member includes a pivotal connection and the second end includes a latched connection.

10. The apparatus of claim 6 wherein the processor includes a thermal connection surface.

11. The apparatus of claim 10 wherein the heat sink engages the thermal connection surface.

12. An information handling system comprising:
a board member;
a support member mounted on the board member;
a processor socket mounted on the board member and coupled to a mass storage device and a system memory;
a processor seated in the processor socket;
a frame member defining a processor aperture, comprising a heat sink engagement surface adjacent to the perimeter of the processor aperture, and mounted on the board member such that the processor extends into the processor aperture;
a plurality of connector members on the frame member, one of the connector members located in the processor aperture and below the heat sink engagement surface;
a curved resilient load member comprising a load member surface wherein the curved resilient load member comprises a first end connected to the connector member located in the processor aperture and below the heat sink engagement surface and a second end connected to another one of the connector members, whereby the connection of the second end deforms the curved load member into a substantially parallel engagement with the processor such that the load member surface is located below the heat sink engagement surface in order for the curved resilient load member to apply a constant compressive force to the processor sufficient to mate the processor with the processor socket;
a heat sink connected to the frame member, supported by the heat sink engagement surface, and located above the load member surface; and the resilient load member having an opening formed therein permitting the processor to extend through the opening into contact with the heat sink, whereby the deformation of the curved resilient load member into a substantially parallel engagement with the processor results in a non-compressive force that is not transferred to the processor socket due to the coupling of the curved load member to the frame member.

13. The system of claim 12 wherein the frame member surrounds the processor socket.

14. The system of claim 12 wherein the support member is adjacent the frame member.

15. The system of claim 12 wherein the first end of the resilient load member includes a pivotal connection and the second end includes a latched connection.

16. The system of claim 12 wherein the processor includes a thermal connection surface.

17. The system of claim 16 wherein the heat sink engages the thermal connection surface.

18. A heat sink mounting apparatus comprising:
a board member;
a processor socket mounted on the board member;
a processor seated in the processor socket;
a frame member defining a processor aperture, comprising a heat sink engagement surface adjacent to the perimeter of the processor aperture, and mounted on the board member such that the processor extends into the processor aperture;
a plurality of connector members on the frame member, one of the connector members located in the processor aperture and below the heat sink engagement surface;
a curved resilient load member comprising a load member surface, wherein the curved resilient load member comprises a first end connected to the connector member located in the processor aperture and below the heat sink engagement surface and a second end connected to another one of the connector members, whereby the connection of the second end deforms the curved load member into engagement with the processor such that the load member surface is located below the heat sink engagement surface in order for the curved resilient load member to apply a constant compressive force to the processor sufficient to mate the processor with the processor socket;
a heat sink mounted on the frame member, thermally coupled to the processor, and supported by the heat sink engagement surface above the load member surface; and
the resilient load member having an opening formed therein permitting the processor to extend through the opening into contact with the heat sink, whereby the deformation of the curved resilient load member into a substantially parallel engagement with the processor results in a non-compressive force that is not transferred to the processor socket due to the coupling of the curved load member to the frame member.

19. A method for mating a processor to a processor socket and mounting a heat sink in an information handling system comprising:
providing a board member;
mounting a support member on the board member;
mounting a processor socket on the board member;
coupling a mass storage device and a system memory to the processor socket;
providing a processor seated in the processor socket;
mounting a frame member on the board member, wherein the frame member defining a processor aperture, comprises a heat sink engagement surface adjacent to the perimeter of the processor aperture;
providing a plurality of connector members on the frame member, one of the connector members located in the processor aperture and below the heat sink engagement surface;
providing a curved resilient load member comprising a load member surface, wherein the curved resilient load member comprises a first end connected to the connector member located in the processor aperture and below the heat sink engagement surface and a second end connected to another one of the connector members, whereby the connection of the second end deforms the curved load member into a substantially parallel engagement with the processor such that the load member surface is located below the heat sink engagement surface in order for the curved resilient load member to apply a constant compressive force to the processor sufficient to mate the processor with the processor socket; and wherein the resilient load member includes an opening formed therein permitting the processor to extend through the opening into contact with a heat sink, whereby the deformation of the curved resilient load member into a substantially parallel engagement with the processor results in a non-compressive force that is not transferred to the processor socket due to the coupling of the curved load member to the frame member; and
providing the heat sink connected to the frame member adjacent to the load member, in engagement with the heat sink engagement surface, thermally coupled to the processor, and located above the load member surface.

* * * * *